United States Patent
Yasumura

(10) Patent No.: US 10,948,688 B2
(45) Date of Patent: Mar. 16, 2021

(54) OPTICAL CIRCUIT SWITCH MIRROR ARRAY CRACK PROTECTION

(71) Applicant: Google LLC, Mountain View, CA (US)

(72) Inventor: Kevin Y. Yasumura, Lafayette, CA (US)

(73) Assignee: Google LLC, Mountain View, CA (US)

( * ) Notice: Subject to any disclaimer, the term of this patent is extended or adjusted under 35 U.S.C. 154(b) by 69 days.

(21) Appl. No.: 15/726,087

(22) Filed: Oct. 5, 2017

(65) Prior Publication Data

US 2018/0210165 A1 Jul. 26, 2018

Related U.S. Application Data

(60) Provisional application No. 62/449,429, filed on Jan. 23, 2017.

(51) Int. Cl.
*G02B 7/182* (2021.01)
*G02B 5/08* (2006.01)
(Continued)

(52) U.S. Cl.
CPC ........ *G02B 7/1821* (2013.01); *B81C 1/00817* (2013.01); *G02B 5/08* (2013.01);
(Continued)

(58) Field of Classification Search
CPC .... G02B 26/0833; G02B 5/08; G02B 26/101; G02B 7/1821; B81B 2201/042; B81B 2203/0109; B81C 1/00817
See application file for complete search history.

(56) References Cited

U.S. PATENT DOCUMENTS 5,452,268 A 9/1995 Bernstein
6,753,638 B2 * 6/2004 Adams ............... H02N 1/008
310/309
(Continued)

FOREIGN PATENT DOCUMENTS

CN 1969217 A 5/2007
CN 101316790 A 12/2008
CN 105829937 A 8/2016

OTHER PUBLICATIONS

Written Opinion of the International Preliminary Examining Authority dated Dec. 19, 2018 in PCT Application No. PCT/US2017/060363 (8 pages).
(Continued)

Primary Examiner — Jade R Chwasz
(74) Attorney, Agent, or Firm — Lerner, David, Littenberg, Krumholz & Mentlik, LLP

(57) ABSTRACT

Optical circuit switches have gained increased prominence in data centers in recent years given their ability to rapidly forward optical data signals without first converting those signals back into the electrical domain. Certain optical circuit switches are implemented using one or more arrays of single-axis or dual-axis gimballed micro-electro-mechanical system (MEMS) (MEMS) mirrors, whose orientations can be adjusted to direct light from an input port of the switch to a desired output port of the switch. Systems and methods according to the present disclosure relate to a microelectromechanical system (MEMS) mirror assembly with crack protection features such as a plurality of nibbles.

16 Claims, 8 Drawing Sheets

(51) Int. Cl.
  *G02B 26/08* (2006.01)
  *B81C 1/00* (2006.01)

(52) U.S. Cl.
  CPC .... *G02B 26/0833* (2013.01); *B81B 2201/042* (2013.01); *B81B 2203/0109* (2013.01)

(56) References Cited

U.S. PATENT DOCUMENTS

| | | | |
|---|---|---|---|
| 6,935,759 B1* | 8/2005 | Staker | B81B 3/0062 359/871 |
| 7,872,394 B1 | 1/2011 | Grillers et al. | |
| 8,570,637 B2* | 10/2013 | Conrad | B81B 3/0048 359/199.4 |
| 9,588,337 B2 | 3/2017 | Van Lierop et al. | |
| 2002/0071166 A1 | 6/2002 | Jin et al. | |
| 2004/0036398 A1 | 2/2004 | Jin | |
| 2007/0287214 A1 | 12/2007 | Huang et al. | |
| 2009/0244676 A1* | 10/2009 | Uchiyama | G02B 26/0841 359/225.1 |
| 2010/0033856 A1* | 2/2010 | Uchiyama | B81B 3/004 359/850 |
| 2012/0162735 A1 | 6/2012 | Uchiyama et al. | |
| 2014/0300942 A1 | 10/2014 | Van Lierop et al. | |
| 2015/0253567 A1 | 9/2015 | Graves | |

OTHER PUBLICATIONS

Office Action dated Nov. 15, 2018 in Taiwanese Patent Application No. 106139241, and English translation thereof (9 pages).
International Search Report and Written Opinion dated Mar. 6, 2018 in International (PCT) Application No. PCT/US2017/060363.
International Preliminary Report on Patentability for International Patent Application No. PCT/US2017/060363 dated Aug. 1, 2019. 12 pages.
Chinese Office Action with Search Report for Application No. 201711338639.0 dated Jan. 10, 2020, 8 pages.

* cited by examiner

OPTICAL CIRCUIT SWITCH MIRROR ARRAY CRACK PROTECTION

RELATED APPLICATIONS

The present application claims priority to, and the benefit of, U.S. Provisional Patent Application No. 62/449,429, titled "OPTICAL CIRCUIT SWITCH MIRROR ARRAY CRACK PROTECTION" and filed Jan. 23, 2017, the entire contents of which are hereby incorporated by reference.

BACKGROUND

Optical circuit switches have gained increased prominence in data centers in recent years given their ability to rapidly forward optical data signals without first converting those signals back into the electrical domain. Certain optical circuit switches are implemented using one or more arrays of single-axis or dual-axis gimballed micro-electro-mechanical system (MEMS) (MEMS) mirrors, whose orientations can be adjusted to direct light from an input port of the switch to a desired output port of the switch.

SUMMARY

According to one aspect, the subject matter described in this disclosure relates to a micro-electro-mechanical system (MEMS) mirror assembly that includes a microelectromechanical system (MEMS) mirror assembly that includes a mirror substrate defining portions of an actuator and a mirror cutout having an internal perimeter. The mirror assembly includes a mirror having a reflective surface positioned within the mirror cutout of the mirror substrate and coupled to the mirror substrate by at least one stator. The mirror has a substantially planar surface defining a primary reflection plane of the mirror. The perimeter of the mirror, when the primary reflection plane of the mirror is parallel to the mirror substrate, is spaced from the internal perimeter of the mirror cutout by a gap around substantially the entire perimeter of the mirror except at the at least one stator. The size of the gap is substantially constant around the perimeter of the mirror other than at a plurality of nibbles defined in at least one of the mirror substrate and the mirror. Each of the nibbles comprises an extension of the gap into the mirror substrate or the mirror, and each nibble has a length of between about 50 microns and about 200 microns, and a width of between about 50 microns and about 100 microns.

According to one aspect, the subject matter described in this disclosure relates to a method of manufacturing a micro-electro-mechanical system (MEMS) mirror assembly that includes defining a cavity in a base substrate, coupling a mirror substrate to the base substrate such that a first side of the mirror substrate faces the cavity in the base substrate, defining portions of a MEMS actuator and a MEMS mirror in the mirror substrate such that a first side of the MEMS mirror faces the cavity in the base substrate and a portion of the mirror substrate is spaced from the mirror by a gap, defining one or more nibbles in at least one of the mirror substrate and the mirror, wherein each of the nibbles comprises an extension of the gap into the mirror substrate or the mirror and each nibble has a length of between about 50 microns and about 200 microns, and a width of between about 50 microns and about 100 microns and disposing a reflective material on a second side of the MEMS mirror opposite the first side of the MEMS mirror.

BRIEF DESCRIPTION OF THE DRAWINGS

The foregoing will be apparent from the following more particular description of example implementations of the invention, as illustrated in the accompanying drawings. The drawings are not necessarily to scale, emphasis instead being placed upon illustrating implementations of the present invention.

For purposes of clarity, not every component may be labeled in every figure. The drawings are not intended to be drawn to scale. Like reference numbers and designations in the various figures indicate like elements.

DETAILED DESCRIPTION

A typical MEMs mirror array includes a plurality of MEMS mirror assemblies. A typical MEMS mirror assembly includes a mirror supported by a gimbal structure and a plurality of actuators. The mirror assembly may be fabricated in silicon-on-insulator (SOI) or double silicon-on-insulator (DSOI) mirror substrates, coupled to a base substrate. The base substrate provides structural stability to the mirror assembly. Actuating one or more of the actuators causes the mirror to tilt about a torsional beam with respect to the base substrate. The structural features of a typical MEMS mirror assembly can be etched into various silicon layers using deep reactive ion etching (DRIE). However, the DRIE process may result in an increased occurrence of heat-induced cracking of the mirror structures that in turn reduces the yield of the mirror arrays. Cracking of the mirror structures can also be caused by the presence of oxide or thin films on the silicon that may create a bimorph type structure that bends under thermal stress.

Systems and methods according to the present disclosure relate to a micro-electro-mechanical system (MEMS) mirror assembly with crack protection features such as one or more nibbles. As used herein, a "nibble" refers to an extension of a gap between two structures into one of the two structures. A MEMS mirror assembly according to an example implementation enables a mirror to rotate about two axes of rotation using a plurality of actuators and dual-axis gimbal structure. In some implementations of a MEMS mirror assembly incorporating vertical comb drive actuators, each actuator includes a drive comb interdigitated with a reference comb.

Figure 1A:
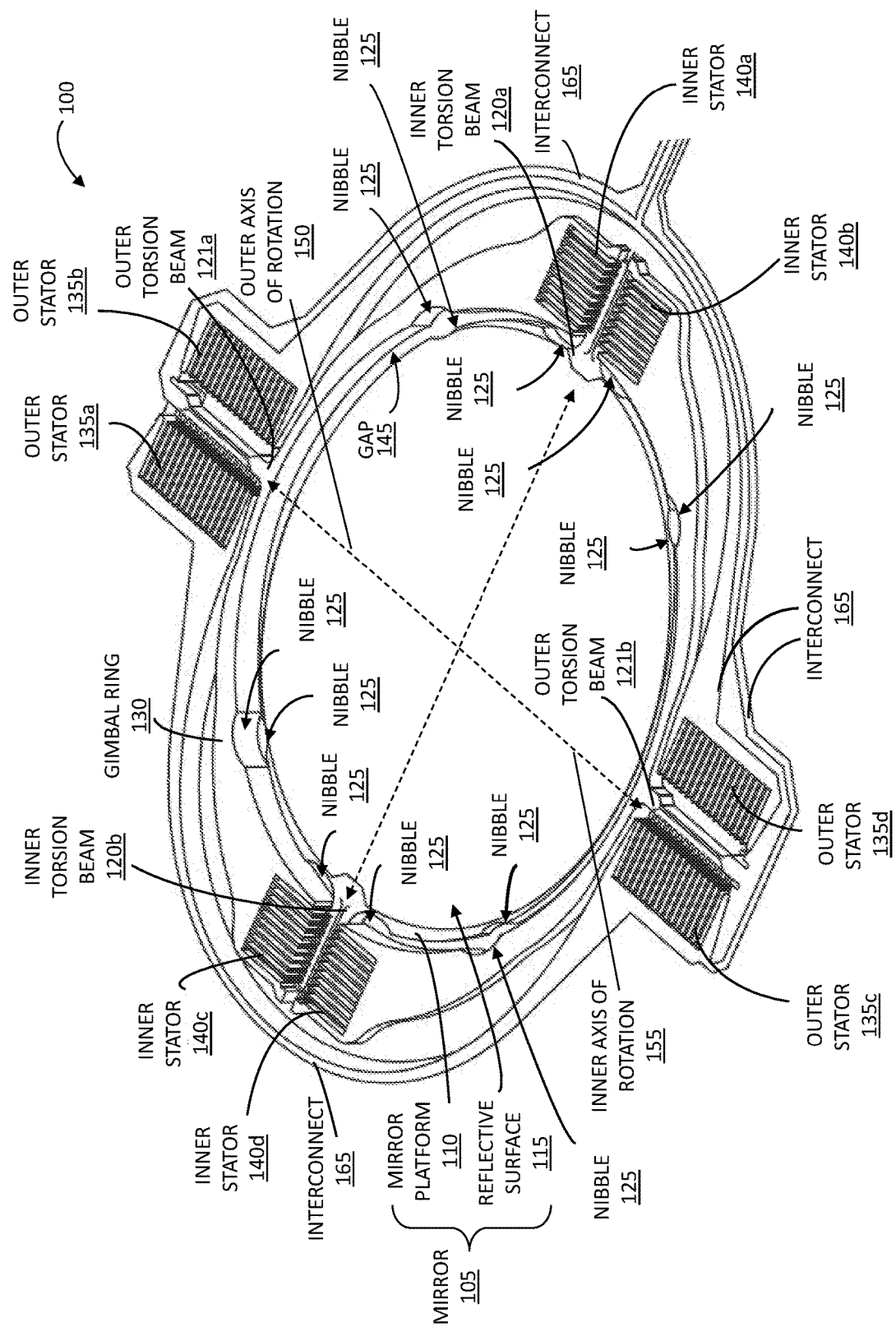
FIG. 1A illustrates a perspective view of a vertical comb drive-actuated, dual axis mirror assembly according to an example implementation.
Figure 1B:
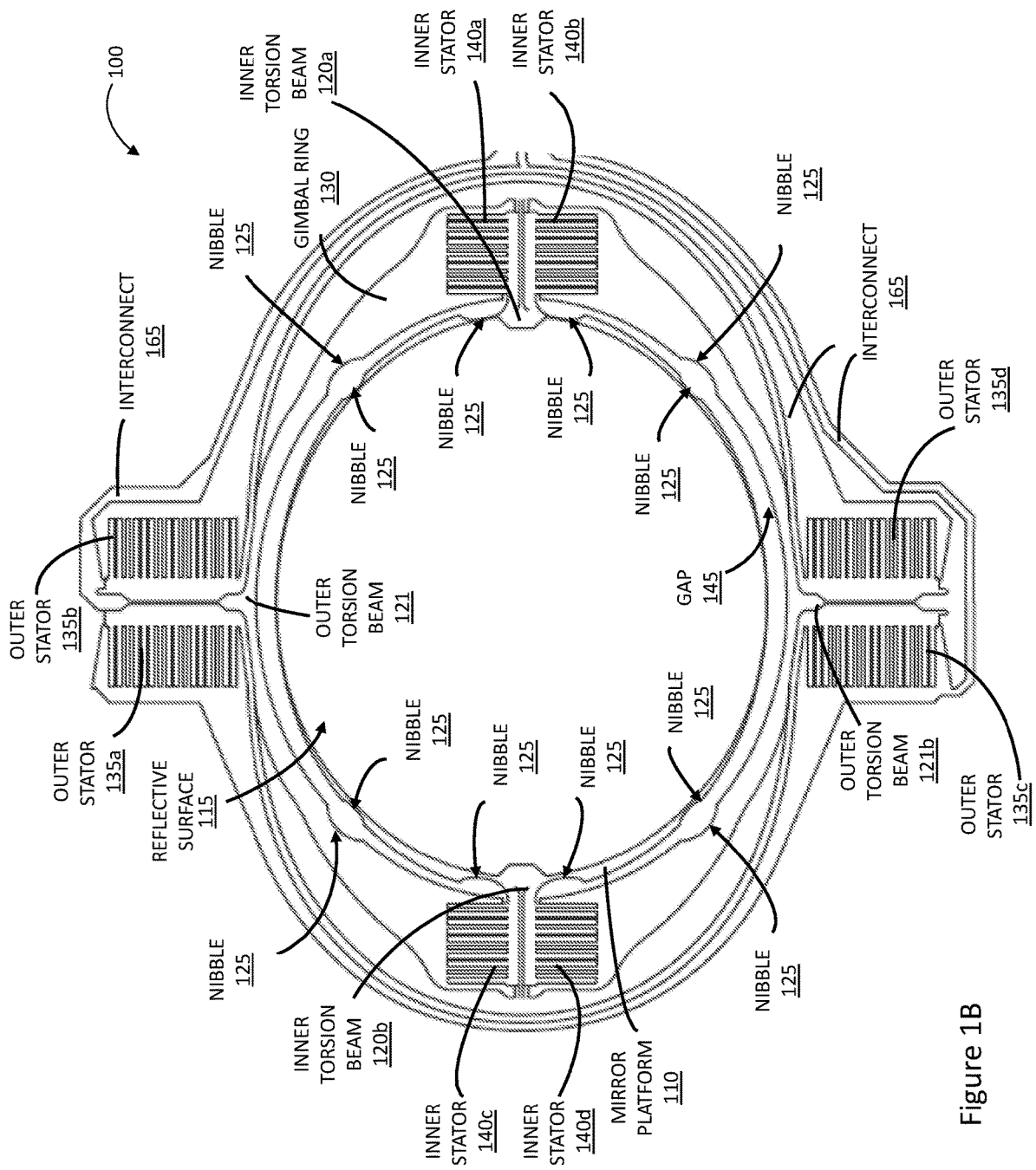
FIG. 1B illustrates a plan view of the mirror assembly shown in FIG. 1A.

FIG. 1A illustrates a perspective view of a vertical comb drive-actuated, dual axis MEMS mirror assembly 100 according to an example implementation. FIG. 1B illustrates a plan view of the mirror assembly 100 shown in FIG. 1A. The mirror assembly 100 includes a circular shaped mirror 105. The mirror 105 includes a mirror platform 110. The mirror platform 110 has a substantially planar reflective surface 115 that defines a primary reflective plane of the mirror 105. In some implementations, the mirror 105 is circular with a diameter between about 100 μm and about 2 mm. In some implementations, the mirror 105 is elliptical or oval in shape with the long and short axes of the mirror 105 ranging between about 500 μm and about 2 mm. In some other implementations, the mirror 105 has a square, rectangular or any other geometric regular or irregular shape.

The mirror assembly 100 is configured to rotate the mirror 105 about two axes of rotation using a plurality of vertical comb drive actuators and a dual-axis gimbal structure such as a gimbal ring 130. The gimbal ring 130 supports the mirror 105. To enable the mirror 105 to rotate about a first axis of rotation such as an inner axis of rotation 155, the mirror platform 110 includes a first inner torsion beam 120a and a second inner torsion beam 120b (collectively referred to as inner torsion beams 120) that extend out from the mirror platform 110 and serve as torsional beams for the mirror 105 along the inner axis of rotation 155.

A plurality of actuators such as a first, second, third and fourth inner actuator (collectively referred to as inner actuators) enable the mirror 105 to tilt around the inner torsion beams 120 about the inner axis of rotation 155. Each of the inner actuators includes a reference comb interdigitated with a drive comb. The first and second inner actuators are located on either side of the first inner torsion beam 120a. The third and fourth inner actuators are located on either side of the second inner torsion beam 120b. The reference combs of the inner actuators extend outward from the inner torsion beams 120. The gimbal ring 130 includes a plurality of comb structures such as a first inner stator 140a, a second inner stator 140b, a third inner stator 140c and a fourth inner stator 140d. The first and second inner stators 140a and 140b serve as the drive combs of the first and second inner actuators respectively. The third and fourth inner stators 140a and 140b serve as the drive combs of the third and fourth inner actuators respectively.

Applying a voltage to a pair of the inner stators 140 (e.g. the inner stators 140a and 140c or the inner stators 140b and 140d) actuates their corresponding inner actuators and causes the mirror 105 to tilt around the inner torsion beams 120 along the inner axis of rotation 155. The reference combs of the inner actuators 140 are maintained at the same potential. The first inner stator 140a and the third inner stator 140c are electrically coupled to each other. The second inner stator 140b and the fourth inner stator are electrically coupled to each other. The first and third inner stators 140a and 140c are electrically isolated from the second and fourth inner stators 140b and 140d. Applying a first voltage to the first and third inner stators 140a and 140c creates a potential difference between the first and third inner stators 140a and 140c and their corresponding reference combs, causing the mirror 105 to tilt in one direction about the inner axis of rotation 155. Applying a second voltage to the second and fourth inner stators 140b and 140d creates a potential difference between the second and fourth inner stators 140b and 140d and their corresponding reference combs, causing the mirror 105 to tilt in the opposite direction about the inner axis of rotation 155.

The mirror assembly 100 is configured to rotate the mirror 105 about a second axis of rotation such as an outer axis of rotation 150 using a plurality of vertical comb drive actuators and the gimbal ring 130. To enable the mirror 105 to rotate about the outer axis of rotation 150, the gimbal ring 130 includes a first outer torsion beam 121a and a second outer torsion beam 121b (collectively referred to as outer torsion beams 121) that serve as torsional beams for the gimbal ring 130 and the mirror 105 along the outer axis of rotation 150.

A plurality of vertical comb drive actuators such as a first, second, third and fourth outer actuator (collectively referred to as outer actuators) enable the gimbal ring 130 and the mirror 105 to tilt around the outer torsion beams 121 about the outer axis of rotation 150. Each of the outer actuators includes a reference comb interdigitated with a drive comb. The first and second outer actuators are located on either side of the first outer torsion beam 121a. The third and fourth outer actuators are located on either side of the second outer torsion beam 121b.

The reference combs of the outer actuators of the mirror assembly 100 extend off of the outer torsion beams 121. The mirror assembly 100 includes a plurality of comb structures such as a first outer stator 135a, a second outer stator 135b, a third outer stator 135c and a fourth outer stator 135d. The first and second outer stators 135a and 135b serve as the drive combs of the first and second outer actuators respectively. The third and fourth outer stators 135c and 135d serve as the drive combs of the third and fourth outer actuators respectively.

Applying a voltage to a pair of the outer stators 135 actuates the corresponding outer actuators and causes the gimbal ring as well as the mirror 105 to tilt around the outer torsion beams 121 about the outer axis of rotation 150. The reference combs of the outer actuators are maintained at the same potential. The first outer stator 135a and the third outer stator 135c are electrically coupled to each other. The second outer stator 135b and the fourth outer stator 135d are electrically coupled to each other. The first and third outer stators 135a and 135c are electrically isolated from the second and fourth outer stators 135b and 135d. Applying a first voltage to the first and third outer stators 135a and 135c creates a potential difference between the first and third outer stators 135a and 135c and their corresponding reference combs, causing the gimbal ring 130 as well as the mirror 105 to tilt in one direction around the outer torsion beams 121 about the outer axis of rotation 150. Applying a second voltage to the second and fourth outer stators 135b and 135d creates a potential difference between the second and fourth outer stators 135b and 135d and their corresponding reference combs, causing the gimbal ring 130 as well as the mirror 105 to tilt in the opposite direction around the outer torsional beams 121 about the outer axis of rotation 150. In some implementations, the inner axis of rotation 155 is perpendicular to the outer axis of rotation 150.

The mirror assembly 100 may be fabricated in silicon-on-insulator (SOI) or double silicon-on-insulator (DSOI) mirror substrates, coupled to a base substrate. The base substrate provides structural stability to the mirror assembly 100. The structural features of the mirror assembly 100, such as the vertical comb drive actuators, the gimbal ring 130 and the mirror 105, including the mirror platform 110, can be etched into the silicon layers of the mirror substrate using deep reactive ion etching (DRIE). In implementations incorporating DSOI mirror substrates, the mirror platform 110 of the mirror 105 and the reference combs of the inner actuators may be defined in the lower silicon layer of the mirror substrate and the drive combs of the inner actuators may be defined in the upper layer of the mirror substrate. In implementations incorporating DSOI mirror substrates, the reference combs of the outer actuators may be defined in the lower silicon layer of the mirror substrate and the drive combs of the outer actuators may be defined in the upper layer of the mirror substrate. Similar comb structures may be present directly under the drive combs in the lower silicon layer, but these lower comb structures are electrically isolated from the actual drive combs by the intervening insulator layer.

The mirror 105 can be tilted with respect to the base substrate about torsional beams (such as the inner and outer torsion beams 120 and 121) formed along the axes of rotation (such as the inner and outer axis of rotation 155 and 150). To control the position of the mirror 105, the lower silicon layer of the mirror substrate (and therefore the reference combs of the vertical comb drive actuators) as well as the base substrate can be maintained at a ground potential. The mirror assembly 100 includes interconnects 165 that may be deposited and patterned on the upper surface of the upper silicon layer of the mirror substrate. The interconnects 165 may carry respective actuation potentials to the drive combs of each actuator of the mirror assembly. Application of a potential to a drive comb results in a potential difference between the portion of the drive comb formed from the upper silicon layer of the mirror substrate and its corresponding reference comb formed in the lower silicon layer of the mirror substrate, causing the mirror platform 110 of the mirror 105 to rotate about an axis of rotation (such as the inner or outer axis of rotation 155 and 150).

The mirror assembly 100 includes a mirror cutout and is defined in the mirror substrate of the mirror assembly 100. The mirror 105 is positioned within the mirror cutout and supported by gimbal ring 130. As mentioned above, the mirror 105 has a substantially planar reflective surface 115 that defines a primary reflection plane of the mirror 105. When the mirror 105 is positioned within the mirror cutout and the primary reflection plane of the mirror 105 is parallel to the mirror substrate of the mirror assembly 100, the space between the perimeter of the mirror 105 and the internal perimeter of the gimbal ring 130 forms an inner gap 145 that is constant around substantially the entire perimeter of the mirror 105 except at the inner stators 140. Additionally, when the mirror 105 is positioned within the mirror cutout and the primary reflection plane of the mirror 105 is parallel to the mirror substrate of the mirror assembly 100, the space between the external perimeter of the gimbal ring 130 and the remainder of the mirror substrate forms an outer gap around substantially the entire external perimeter of the gimbal ring 130 except at the outer stators 135.

The mirror assembly 100 may be used in a mirror array. To allow for increased packing density of a plurality of mirror assemblies in the mirror array and to obtain desired mechanical performance, the spacing between the mirror 105 and the gimbal ring 130 (i.e. the inner gap 145) and the spacing between the gimbal ring 130 and the remainder of the mirror substrate (i.e. the outer gap), respectively, are quite small. For example, the inner gap 145 and the outer gap can generally be on the order of between about 3 μm and about 10 μm wide. In some implementations, the inner gap 145 between the mirror 105 and the gimbal ring 130 is larger than the outer gap between the gimbal ring 130 and the upper surface of the upper silicon layer of the mirror substrate.

As mentioned above, the structural features of the mirror assembly such as the vertical comb drive actuators, the gimbal ring 130 and the mirror 105 can be etched into the silicon layers using deep reactive ion etching (DRIE). Given that the inner gap 145 between the mirror 105 and the gimbal ring 130 and the outer gap (not shown) between the gimbal ring 130 and the remainder of the mirror substrate are relatively narrow relative to the thickness of the substrates and the amount of heat given off by a typical DRIE process, the mirror array may have a reduced yield due to heat-induced cracking of the mirror structures of the mirror assemblies. In particular, the DRIE process may result in an increased occurrence of cracks where the inner stators 140 meet the mirror 105 and where the outer stators 135 meet the gimbal ring 130.

As mentioned above, the cracks in the mirror 105 may be induced by process related heat or by the presence of oxide or thin films on the silicon that may create a bimorph type structure that bends under thermal stress. The occurrence of cracks in the mirror 105 may be reduced in the mirror assembly 100 through the introduction of a plurality of nibbles at strategic locations along the perimeter of the gimbal ring 130 and/or the perimeter of the mirror 105. In FIGS. 1A and 1B, the size of the inner gap 145 between the mirror 105 and the gimbal ring 130 is substantially constant around the perimeter of the mirror 105 other than at the inner stators 140 and a plurality of nibbles 125. The nibbles 125 are defined in at least one of the gimbal ring 130 (formed from the mirror substrate) and the mirror platform 110 of the mirror 105. Each of the plurality of nibbles 125 includes an extension of the inner gap 145 into the gimbal ring 130 and/or the mirror platform 110 of the mirror 105 and locally increases the size of the inner gap 145 between the mirror 105 and the gimbal ring 130. The mirror assembly 100 includes a plurality of nibbles 125 that extend into the mirror platform 110 of the mirror and not the gimbal ring 130. The mirror assembly 100 includes a plurality of nibbles that extend into the mirror platform 110 and the gimbal ring 130. In some implementations, the mirror assembly 100 may include a plurality of nibbles 125 that extend into the gimbal ring 130 but not the mirror platform 110.

As mentioned above, the DRIE process may result in an increased occurrence of cracks where the inner stators 140 meet the mirror 105. Therefore, the mirror assembly 100 includes a plurality of nibbles 125 adjacent to the inner stators 140 that extend into the mirror platform 110 and not the gimbal ring 130. Further away from the inner stators 140, the mirror assembly 100 includes a plurality of nibbles 125 that extend into both the mirror platform 110 and the gimbal ring 130. As mentioned above, the DRIE process may also result in an increased occurrence of cracks where the outer stators 135 meet the gimbal ring 130. In some implementations, one or more of the nibbles 125 can be introduced around the external perimeter of the gimbal ring 130 and/or adjacent to one or both ends of the outer stators 135. In such implementations, each nibble locally increases the size of the outer gap.

In some implementations, other than at the nibbles, the inner stators 140 or the outer stators 135, the inner gap 145 around the perimeter of the mirror 105 is substantially constant. Similarly, in some implementations, other than at the location of the nibbles 125 or at the inner stators 140 or the outer stators 135, the gap 145 around the external perimeter of the gimbal ring 130 is also substantially constant.

In some implementations, a plurality of nibbles 125 can be located at regular intervals, e.g., every 90 degrees around the perimeter of the mirror 105, such that lines drawn between alternating nibbles 125 (i.e., not including those immediately adjacent to the inner stators 140) bisect the angles formed between the inner and outer axes of rotation 155 and 150. In other implementations, a plurality of nibbles 125 can be located every 60 degrees, or other regular interval, around the perimeter of the mirror 105. The nibbles 125 are sized so that they are larger than the smallest openings defined through the upper and lower silicon layers of the mirror assembly 100. In some implementations, the nibbles 125 are generally elliptical in shape. In some implementations, the length of the nibbles 125 can be, in a direction tangential to the perimeter of the mirror 105, between about 50 μm and about 200 μm long. In some implementations, the ratio of the length of the nibbles 125 in a direction tangential to the perimeter of the mirror 105 to the thickness of the mirror substrate can be up to about 4:1 with a maximum nibble length reaching to about 200 μm. In some implementations, the nibbles 125 can be, in a radial dimension of the mirror 105, between about 50 μm and about 100 μm wide. In some implementations, the ratio of the width of the nibbles 125 in the radial dimension of the mirror 105 to the thickness of the mirror substrate can be between about 1:1 and about 2:1 with a maximum nibble width reaching to about 100 μm. Other sizes and shapes of the nibbles 125 can be used without departing from the scope of the invention.

As mentioned above, the structural features of the mirror assembly, such as the vertical comb drive actuators, the gimbal ring 130 and the mirror 105, can be etched into the silicon layers using deep reactive ion etching (DRIE). In some implementations, the smallest feature size of these structural components can be much smaller than the thickness of the silicon layers, for example, on the order of between about 1 μm and about 10 μm. In some implementations, the tines (or "fingers") of the vertical comb drive actuators can be between about 1.0 μm and about 10.0 μm wide, though other dimensions are also suitable. In some implementations, the tines (or "fingers") of the vertical comb drive actuators can be between about 10 μm and about 200 μm long, though other dimensions are also suitable.

In some implementations, the reflective surface 115 may be formed by coupling a reflective coating to the upper-most surface of the mirror 105. In some implementations, the reflective coating can be formed from a deposited layer of metal, such as, without limitation, aluminum, silver, or gold. In some implementations, the reflective coating can be formed from a deposited layer of metal and a layer of dielectric material or alternating layers of metal and dielectric material, forming a dielectrically enhanced mirror or a dielectric mirror, respectively. In other implementations, other reflective materials can be used without departing from the scope of the disclosure.

Figure 2:
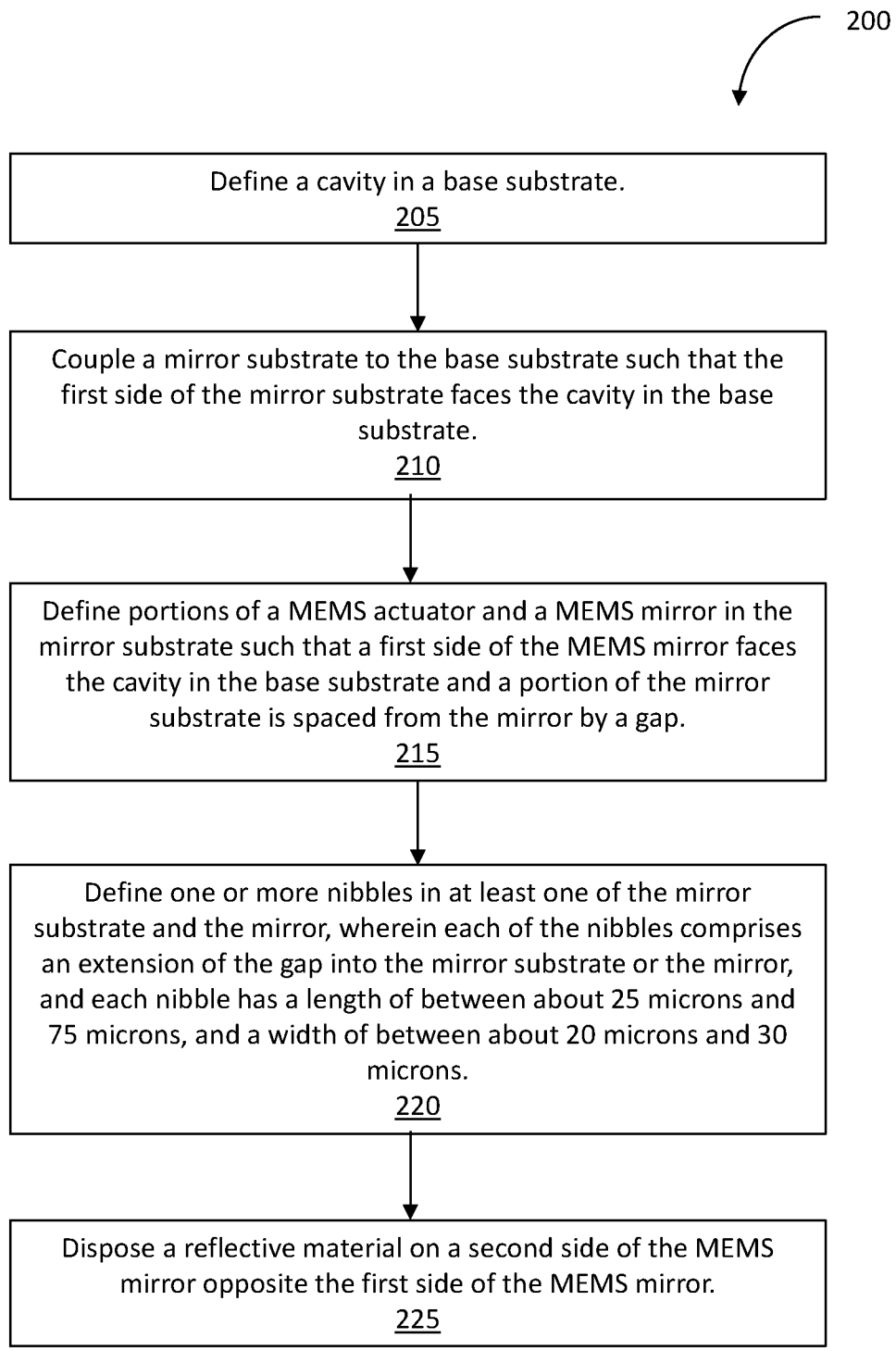
FIG. 2 illustrates a flow diagram of an example method of manufacturing a mirror assembly such as the mirror assembly shown in FIGS. 1A and 1B.

FIG. 2 illustrates a flow diagram of an example method 200 of manufacturing the mirror assembly 100 in FIGS. 1A and 1B. FIGS. 3A-3I illustrate cross sectional views of a portion of the mirror assembly 100 in FIGS. 1A and 1B at various stages of the method 200 in FIG. 2. The method 200 includes defining a cavity in a base substrate (stage 205), coupling a mirror substrate to the base substrate such that a first side of the mirror substrate faces the cavity in the base substrate (stage 210), defining portions of a MEMS actuator and a MEMS mirror in the mirror substrate such that a first side of the MEMS mirror faces the cavity in the base substrate and a portion of the mirror substrate is spaced from the mirror by a gap and, defining one or more nibbles in at least one of the mirror substrate and the mirror, wherein each of the nibbles comprises an extension of the gap into the mirror substrate or the mirror and each nibble has a length of between about 50 microns and 200 microns, and a width of between about 50 microns and 100 microns (stage 215) and disposing a reflective material on a second side of the MEMS mirror opposite the first side of the MEMS mirror (stage 220).

Figure 3A:
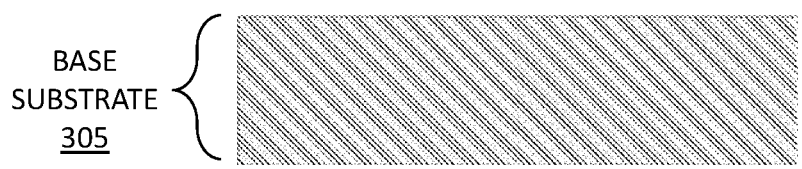
FIGS. 3A-3I illustrate cross sectional views of a portion of the mirror assembly manufactured according to the method shown in FIG. 2.
Figure 3B:
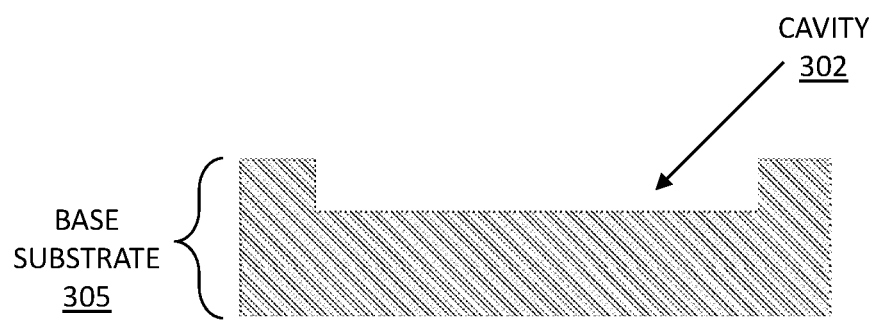
Figure 3C:
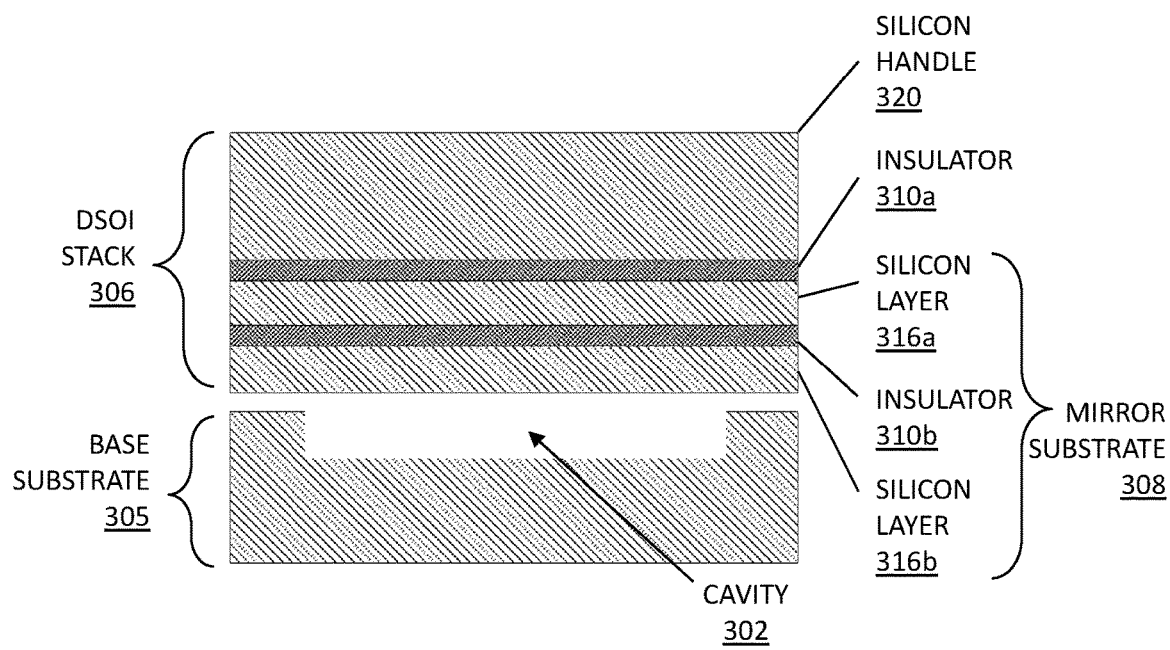

The method 200 includes defining a cavity in a base substrate (stage 205). As shown in FIGS. 3A and 3B, a cavity 302 is defined in a base substrate 305 by etching the cavity 302 into the base substrate 305. The method 200 includes coupling a mirror substrate to the base substrate such that a first side of the mirror substrate faces the cavity in the base substrate (stage 210). As shown in FIG. 3C, a DSOI stack 306 includes a silicon handle 320, a first insulator layer 310a and a mirror substrate 308. The mirror substrate 308 includes a first silicon layer 316a, a second insulator layer 310b and a second silicon layer 316b. The first side of the first silicon layer 316a faces the cavity 302 in the base substrate 305.

Figure 3D:
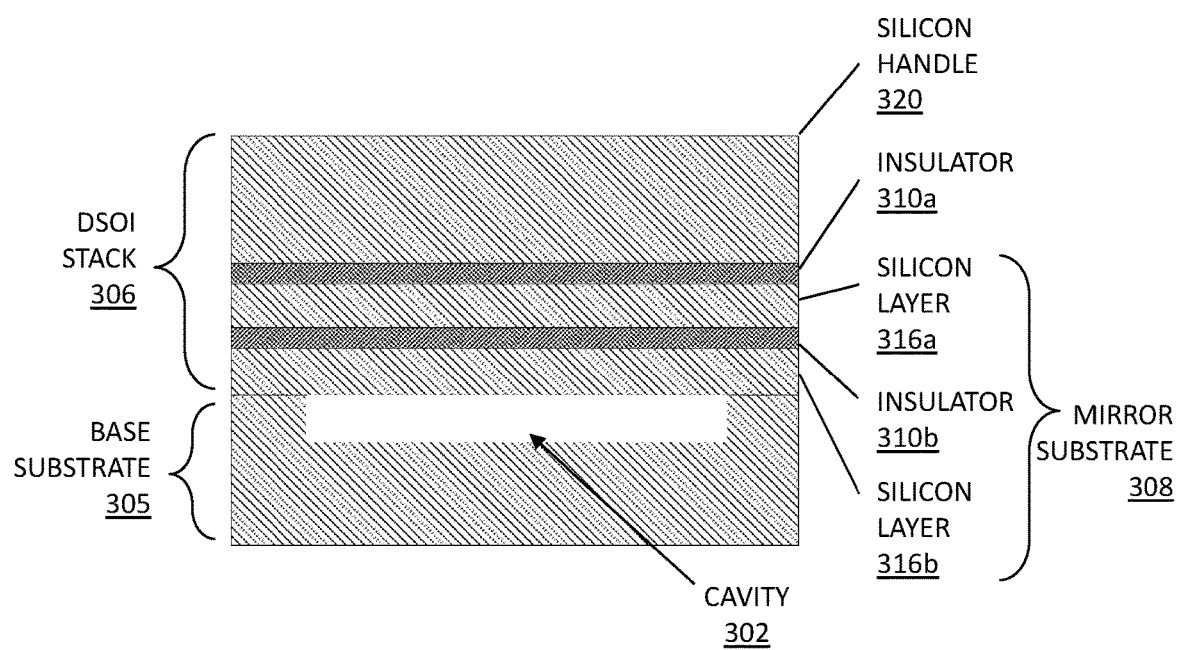
Figure 3E:
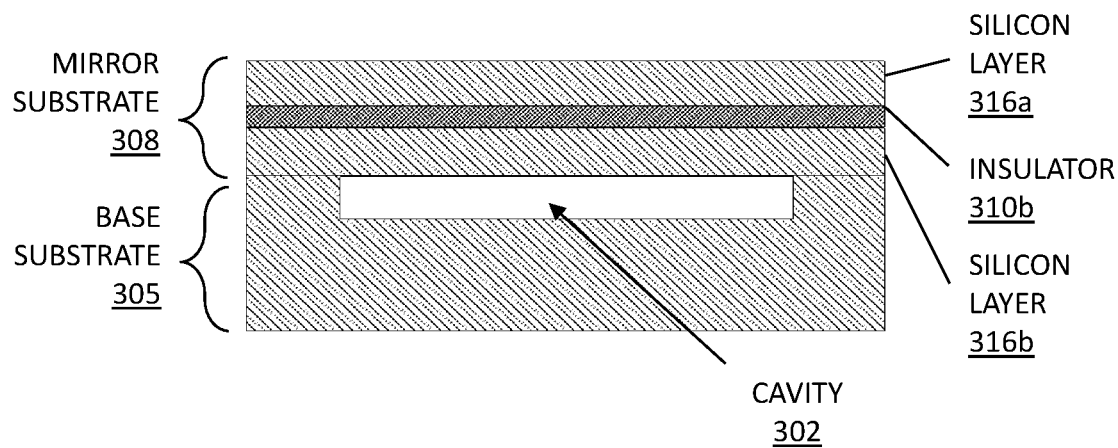

As shown in FIG. 3D, the DSOI stack 306 is coupled to the base substrate 305 by bonding the DSOI stack 306 to the base substrate 305. In some implementations, the DSOI stack 306 is fusion bonded to the base substrate 305. After bonding, as shown in FIG. 3E, the silicon handle 320 and the first insulator layer 310a is removed, leaving the mirror substrate 308 bonded to the base substrate 305.

Figure 3F:
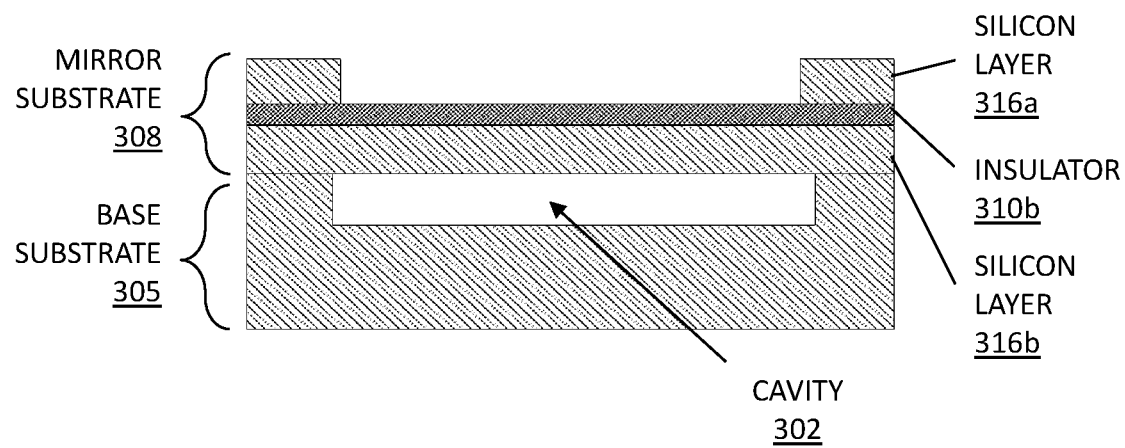

As shown in FIG. 3F, the first silicon layer 316a of the mirror substrate 308 is etched such that the second insulator layer 310b is exposed. This etch also defines other features in the upper silicon layer, such as the drive combs and portions of the torsion beams.

Figure 3G:
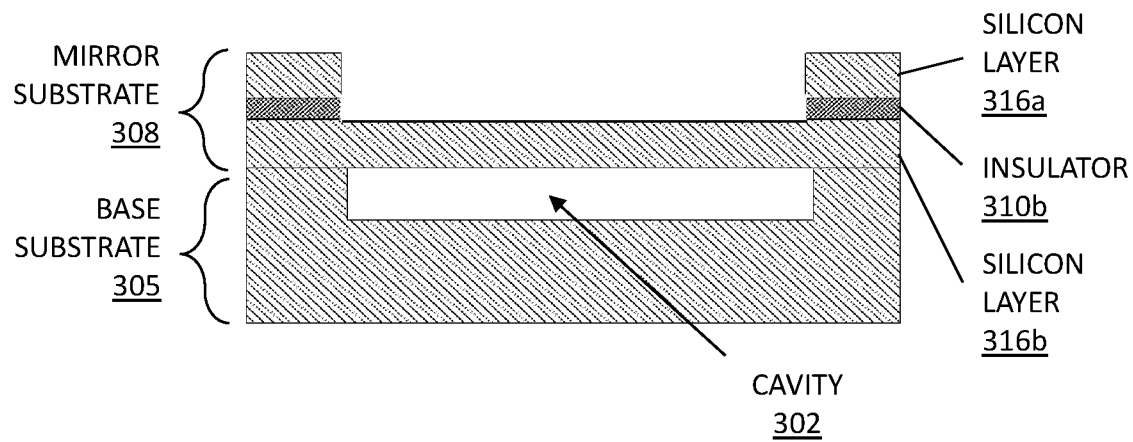
Figure 3H:
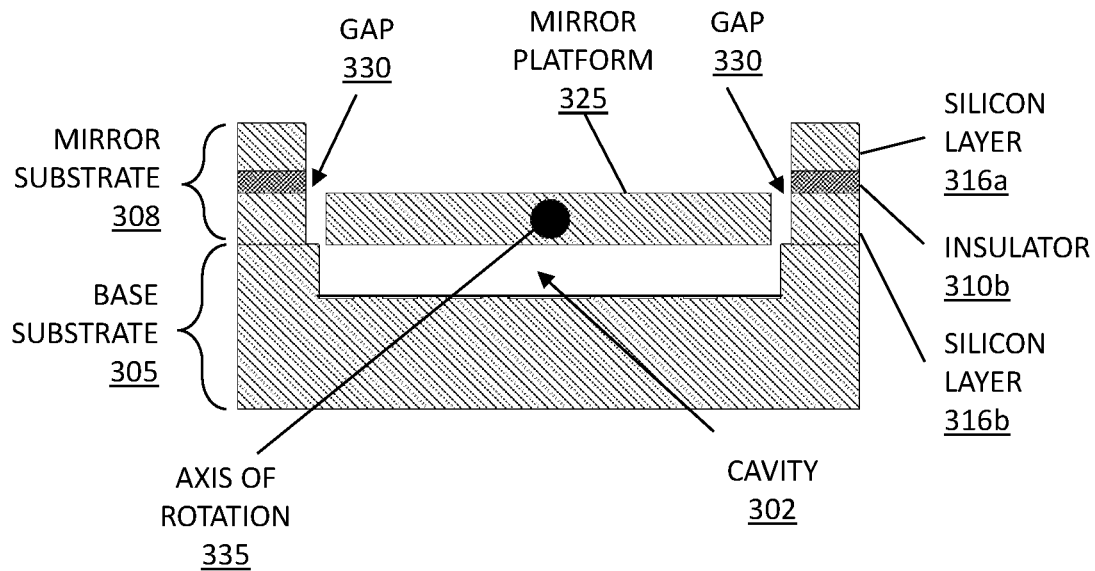

The method 200 includes defining additional portions of MEMS actuators, a gimbal structure and a MEMS mirror in the mirror substrate such that a first side of the MEMS mirror faces the cavity in the base substrate and a portion of the mirror substrate is spaced from the mirror by a gap (stage 215). As shown in FIG. 3G, the exposed portion of the second insulator layer 310b of the mirror substrate 308 is removed thereby exposing a portion of the second silicon layer 316b. As shown in FIG. 3H, one or more portions of the exposed portion of the second silicon layer 316b are etched to define a mirror platform 325 of a MEMS mirror. The first side of the mirror platform 325 faces the cavity 302 in the base substrate 305. Lower portions of one or more MEMS actuators (such as the reference combs of the vertical comb drive actuators of the mirror assembly 100 in FIGS. 1A and 1B) are also defined in the mirror substrate 308.

As mentioned above in the discussion of the mirror assembly 100 in FIGS. 1A and 1B, the application of a potential to a drive comb results in a potential difference between the portion of the drive comb formed from the first silicon layer of the mirror substrate and its corresponding reference comb formed in the second silicon layer of the mirror substrate, causing the mirror platform of the mirror to rotate about the axis of rotation. The cavity 302 in the base substrate 305 provides room for the mirror platform 325 to rotate about the axis of rotation 335. The constrained size of the cavity 302 provides for fluid damping of the mirror's movement upon actuation. Some of the etched portions of the second silicon layer 316b also define a gap 330 between the mirror platform 325 of the mirror and a portion of the mirror substrate 308.

Figure 3I:
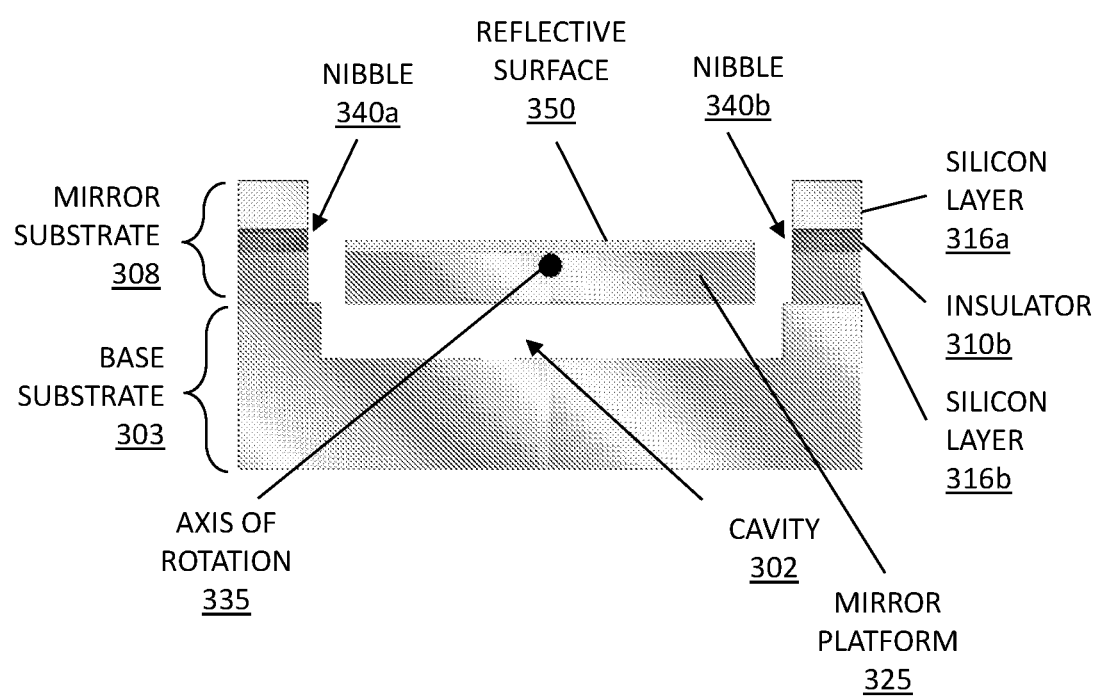

The method 200 includes defining one or more nibbles in at least one of the mirror substrate and the mirror, wherein each of the nibbles comprises an extension of the gap into the mirror substrate or the mirror and each nibble has a length of between about 50 microns and 200 microns, and a width of between about 50 microns and 100 microns (stage 215). As shown in FIG. 3I, a first nibble 340a and a second nibble 340b (collectively referred to as nibbles 340) in the mirror substrate 308 and/or the mirror platform 325 of the mirror. In order to fabricate the nibbles 340, the masks used in the etching of the first silicon layer 316a and the second insulator layer 310b of the mirror substrate 308 include larger openings where the nibbles 340 are desired. An opening in the mirror substrate 308 in the region in which a nibble 340 is located is larger in size compared to an opening in a region without a nibble 340. During the fabrication process, the silicon exposed through the larger openings corresponding to the nibbles 340 etches faster than the silicon exposed through the narrower openings corresponding to the regions lacking the nibbles 340, enabling faster completion of the etching through the silicon in the regions that have the nibbles 340. As a result, if a crack were to begin elsewhere and propagate towards the location of a nibble 340, the lack of material at the location of the nibble 340 can halt the progression of the crack beyond the location of the nibble 340. In some implementations, the nibbles 340 and 125 are defined as discussed above with respect to FIGS. 1A and 1B.

The method 200 includes disposing a reflective material on a second side of the MEMS mirror platform opposite the first side of MEMS mirror platform (stage 220). As shown in FIG. 3H, the mirror platform 110 has a substantially planar surface and includes a reflective surface 115 that defines a primary reflective plane of the mirror. In some implementations, the reflective surface 115 may be formed by coupling a reflective coating to the upper-most surface of the mirror platform 210. In some implementations, the reflective coating can be formed from a deposited layer of metal, such as, without limitation, aluminum, silver, or gold. In some implementations, the reflective coating can be formed from a deposited layer of metal and a layer of dielectric material or alternating layers of metal and dielectric material, forming a dielectrically enhanced mirror or a dielectric mirror. In some other implementations, a reflective material can be formed on second side of the MEMS mirror platform prior to the MEMS mirror platform being bonded to the base substrate.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described components and systems can generally be integrated together in a single product or packaged into multiple products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements. Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be used.

What is claimed is:

1. A microelectromechanical system (MEMS) mirror assembly comprising:
   a mirror substrate defining portions of an actuator, a gimbal structure and a mirror cutout, the mirror cutout having an internal perimeter;
   a mirror including a mirror platform and a reflective surface, the mirror positioned within the mirror cutout of the mirror substrate and coupled to the mirror substrate by at least one stator, wherein:
   the mirror is supported by the gimbal structure;
   the mirror has a substantially planar surface defining a primary reflection plane of the mirror,
   the perimeter of the mirror, when the primary reflection plane of the mirror is parallel to the mirror substrate, is spaced from the outer perimeter of the mirror cutout by a gap around substantially the entire perimeter of the mirror except at the at least one stator,
   the size of the gap is substantially constant around the perimeter of the mirror other than at the at least one stator and at a plurality of nibbles defined in at least one of the mirror substrate and the mirror, wherein each of the nibbles comprises an extension of the gap into the mirror substrate and the mirror, and each nibble has a length of between about 50 microns and 200 microns, and a width of between about 50 microns and 200 microns,
   the mirror platform comprises:
     a first torsion beam and a second torsion beam extending from the mirror platform along a first axis of rotation; and
   the gimbal structure comprises:
     a third torsion beam and a fourth torsion beam extending from the gimbal structure along a second axis of rotation, perpendicular to the first axis of rotation, wherein,
     at least one of the plurality of nibbles is defined along a circumferential segment of the mirror platform extending between the first torsion beam and the second torsion beam such that the at least one of the plurality of nibbles locally increases the size of the gap between the mirror platform and the gimbal structure such that the gap extends into the mirror platform and the gimbal structure; or
     at least one of the plurality of nibbles is defined along a circumferential segment of the gimbal structure extending between the third torsion beam and the fourth torsion beam such that the at least one of the plurality of nibbles locally increases the size of the gap between the mirror platform and the gimbal structure such that the gap extends into the mirror platform and the gimbal structure.

2. The mirror assembly of claim 1, wherein at least one of the plurality of nibbles is defined in the mirror immediately adjacent to the at least one stator and comprises an extension of the gap into the mirror.

3. The mirror assembly of claim 1, wherein the nibbles are elliptical in shape.

4. The mirror assembly of claim 1, wherein the ratio of the length of the nibbles in a direction tangential to the perimeter of the mirror to the thickness of the mirror substrate can be up to about 4:1 and wherein a ratio of the width of the nibbles in a radial dimension of the mirror to the thickness of the mirror substrate is between about 1:1 and about 2:1.

5. The mirror assembly of claim 1, wherein the nibbles are defined around the perimeter of the mirror and each of the at least one stator has at least one nibble immediately adjacent to it.

6. The mirror assembly of claim 5, wherein the nibbles are defined around the perimeter of the mirror at intervals of 90 degrees.

7. The mirror assembly of claim 5, wherein the nibbles are defined around the perimeter of the mirror at intervals of 60 degrees.

8. The mirror assembly of claim 1, wherein the mirror substrate includes an upper silicon layer and a lower silicon layer, and wherein an opening in the mirror substrate in a region in which a nibble is located is larger in size compared to an opening in any region of the mirror substrate that is not adjacent a nibble.

9. A method of manufacturing a microelectromechanical system (MEMS) mirror assembly comprising:
    defining a cavity in a base substrate;
    coupling a mirror substrate to the base substrate such that a first side of the mirror substrate faces the cavity in the base substrate;
    defining portions of a MEMS actuator, a gimbal structure and a MEMS mirror having a mirror platform in the mirror substrate such that a first side of the MEMS mirror faces the cavity in the base substrate and a portion of the mirror substrate is spaced from the mirror by a gap and defining one or more nibbles in at least one of the mirror substrate and the mirror, wherein each of the nibbles comprises an extension of the gap into the mirror substrate and the mirror, and each nibble has a length of between about 50 microns and 200 microns, and a width of between about 50 microns and 100 microns, wherein a first torsion beam and a second torsion beam extend from the mirror platform along a first axis of rotation, a third torsion beam and a fourth torsion beam extend from the gimbal structure along a second axis of rotation, perpendicular to the first axis of rotation, wherein at least one of the plurality of nibbles is defined along a circumferential segment of the mirror platform extending between the first torsion beam and the second torsion beam such that the at least one of the plurality of nibbles locally increases the size of the gap between the mirror platform and the gimbal structure such that the gap extends into the mirror platform and the gimbal structure, or at least one of the plurality of nibbles is defined along a circumferential segment of the gimbal structure extending between the third torsion beam and the fourth torsion beam such that the at least one of the plurality of nibbles locally increases the size of the gap between the mirror platform and the gimbal structure such that the gap extends into the mirror platform and the gimbal structure; and
    disposing a reflective material on a second side of the MEMS mirror opposite the first side of the MEMS mirror.

10. The method of claim 9, further comprising providing a double silicon-on-insulator (DSOI) stack including a silicon handle and the mirror substrate, wherein the mirror substrate includes a first silicon layer, an insulator layer and a second silicon layer.

11. The method of claim 10, wherein defining the mirror comprises:
    removing the silicon handle of the DSOI stack;
    etching a portion of the first silicon layer of the mirror substrate to expose a portion of the insulator layer of the mirror substrate; and
    removing the exposed portion of the insulator layer of the mirror substrate such that a portion of the second silicon layer is exposed.

12. The method of claim 11, wherein defining one or more nibbles comprises:
    etching one or more portions of the exposed portion of the second silicon layer, wherein the exposed portion of the second silicon layer defines the second side of the MEMS mirror.

13. The method of claim 11, wherein the masks used in etching the first silicon layer and the removing the exposed portion of the insulator layer of the mirror substrate includes openings corresponding to a size of the nibbles that are larger than the openings corresponding to a size of the gap.

14. The method of claim 13, wherein the size of the gap is substantially constant around the perimeter of the mirror other than at the plurality of nibbles and the at least one stator.

15. The method of claim 13, wherein the ratio of the length of the nibbles in a direction tangential to the perimeter of the mirror to the thickness of the mirror substrate can be up to about 4:1 with a maximum nibble length of about 200 µm and the ratio of the width of the nibbles in the radial dimension of the mirror to the thickness of the mirror substrate can be between about 1:1 and about 2:1 with a maximum nibble width of about 100 µm.

16. The method of claim 9, wherein the nibbles are defined around the perimeter of the mirror and each of the at least one stator has at least one nibble immediately adjacent to it.

* * * * *